United States Patent [19]

Sibley

[11] 4,365,164

[45] Dec. 21, 1982

[54] VITAL CONTACT ISOLATION CIRCUIT

[75] Inventor: Henry C. Sibley, Adams Basin, N.Y.

[73] Assignee: General Signal Corporation, Stamford, Conn.

[21] Appl. No.: 225,813

[22] Filed: Jan. 16, 1981

[51] Int. Cl.³ ............................................ G02B 27/00
[52] U.S. Cl. .................................... 250/551; 307/311; 307/442
[58] Field of Search ................. 250/551; 307/311, 442

[56] References Cited

U.S. PATENT DOCUMENTS 3,995,173 11/1976 Sibley .............................. 307/311 X Primary Examiner—David C. Nelms
Assistant Examiner—Darwin R. Hostetter
Attorney, Agent, or Firm—Pollock, Vande Sande & Priddy

[57] ABSTRACT

A contact monitoring circuit for producing a dynamic signal representative of the state of a contact. The circuit includes a control signal generator for generating a pair of optical pulse streams comprised of alternate and sequential optical pulses. A pair of gating means, each responsive to one of the pair of pulse streams, connects each of two conductors to one of a positive and negative source of potential in time coincidence with the associated pulse stream. A circuit means, including an optical coupler, the contact being monitored and a fixed potential, has a complete supply circuit during times coincident with only one of the pulse streams, the condition of the contact determines which of the pulse streams will complete the supply circuit. Therefore, the optical coupler produces a dynamic signal representative of the contact state.

14 Claims, 4 Drawing Figures

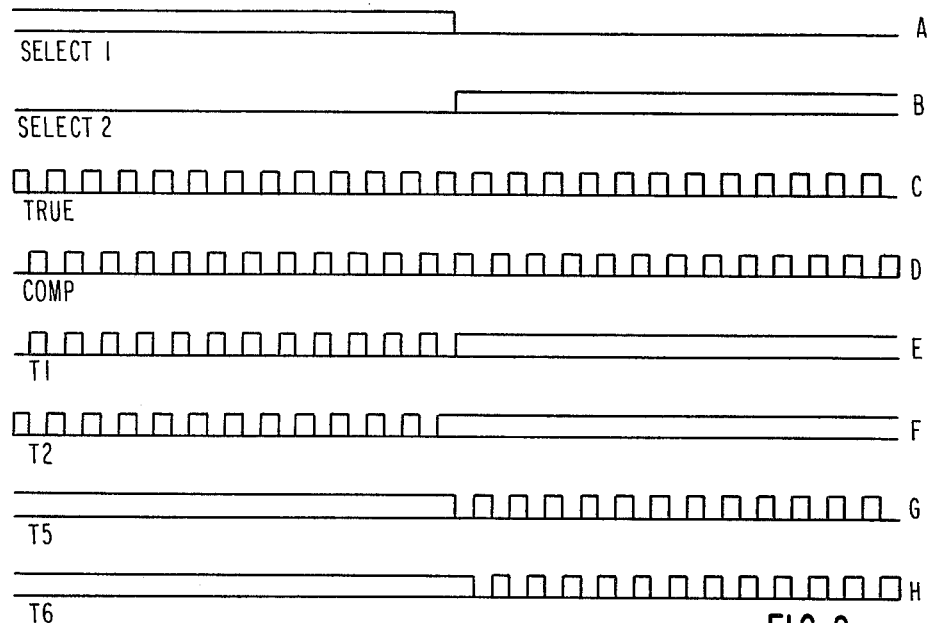
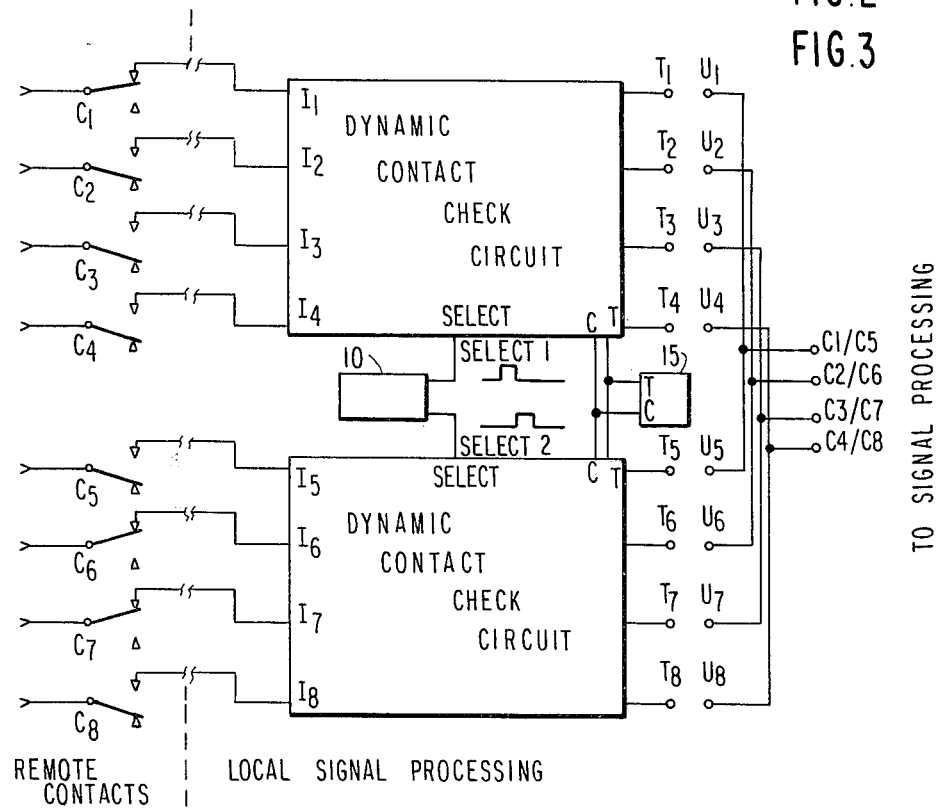
FIG.2
FIG.3

VITAL CONTACT ISOLATION CIRCUIT

FIELD OF THE INVENTION

The present invention relates to contact monitoring circuits, especially those useful in coupling vital contacts to electronic circuitry so as to enable dynamic cycle checking.

BACKGROUND OF THE INVENTION

When electronic devices (microprocessors, for example) are used in systems requiring fail safe capabilities, the designer must take special precautions to ensure that fail safe qualities are maintained, i.e., ensuring that failures are not unsafe. Electronic devices are different than vital relays in that such devices can fail in either one of the two states allowed for the device and accordingly, neither state can be faithfully assigned as more or less restricted. One of the techniques designers use to observe the vital characteristics in electronic circuitry is dynamic cycle checking; in this technique the permissive state is a controlled cycling of the device between its two different states, a steady condition in either state is restrictive. Examples of dynamic cycle checking are shown in my prior U.S. Pat. Nos. 3,995,173 and 4,090,173 entitled respectively, "SOLID STATE FAIL SAFE LOGIC SYSTEM" and "VITAL DIGITAL COMMUNICATION SYSTEM", both assigned to the assignee of this application.

When the input to an electronic system is the condition of a contact of a vital relay, special precautions must be taken to ensure that the state of the contact is dynamically cycle checked. This can be simply effected by feeding a dynamic signal over the contact of the vital relay, and in this regard see my above-referenced U.S. Pat. No. 3,995,173. This approach is not available if the contact is located more than a few feet away from the electronic system since the presence of a relatively long line coupling a dynamic signal to an electronic system makes the system unreliable (or even unsafe) by reason of noise or unwanted coupling to/from other circuits.

SUMMARY OF THE INVENTION

Therefore, in accordance with the present invention, a dynamic contact check circuit is provided in which the energy switched by the contacts is supplied by the signal system battery and therefore a requirement for a dynamic signal source is eliminated. Further, in accordance with the present invention, the electronic system power is isolated from the signal battery thereby further reducing the probability of unwanted energy coupling. The electrical lines connecting the electronic system and the contacts to be checked may be protected by filters and surge protectors. The signal on the electrical lines connecting the contacts to be checked and the electronic system may be D.C. The dynamic signal is not available at the electrical line coupling the contacts to be checked and the electronic system, nor at filters which may also be connected in these lines. And finally, signal multiplexing, that is, generating a signal which represents the state of more than one contact, is readily achieved.

In accordance with the invention a control means is provided for generating two streams of alternate and sequential control pulses. A pair of control pulse responsive switches are provided, each responsive to a different one of the streams of control pulses. A pair of conductors are provided and a pair of gating means is provided, each of the gating means is responsive to a different one of the control pulse responsive switches, the gating means connecting the conductors to two different potential sources in time coincidence to the two streams of control pulses, and accordingly, one of the conductors is switched alternately between one potential and a high impedance condition, and the other conductor is alternately and sequentially switched between another potential and a high impedance condition. Finally, a circuit means which includes the contact to be monitored and which is connected to the two different conductors includes an isolator, the circuit means energizes the isolator in coincidence with one or another of said control pulse streams depending upon the condition of the contact to be monitored, and accordingly, when the contact is in one state the isolator is energized coincident with one of the streams of pulses, and when the contact is in the other state the isolator is energized coincident with one of the streams of pulses.

In a specific embodiment of the invention, which is disclosed hereinafter the control pulses are optical, and the circuit means includes a diode bridge-like arrangement which can be powered alternately by the two conductors, for conducting current in two different directions, the supply circuit for the bridge-like arrangement is only completed when the bridge-like arrangement is supplied by one of the two potentials of the two potential sources connected to the two conductors; and the potential source which completes the power supply for the bridge-like arrangement depends upon whether or not the contact being monitored is in one state or another and correspondingly is at a source of potential, or not. The bridge-like arrangement includes an isolator comprising an LED or other optical signal generating device, for generating an optical signal in response to current flowing therethrough; of course, current only flows through the bridge-like arrangement when its power supply circuit is completed. Finally, the isolator also includes an optically responsive switch with an output conductor which is switched from a high to low potential when the current responsive device in the bridge-like arrangement produces an optical signal. Accordingly, regardless of the position of the contact being monitored, the output of the optical coupler (isolator) produces a pulse stream, however, the timing of that pulse stream is different depending upon the condition of the contact being monitored, and accordingly, the condition of the contact has been translated into a dynamic signal which is representative of the contact condition.

Multiplying a number of input contacts, is handled by multiplying the number of bridge-like devices coupled to the conductors with a commensurate increase in the number of isolators (optical couplers) and output lines.

Since typically sampling of contact positions is sufficient (assuming sufficiently high sampling rate), the output signals can be time multiplexed by splitting the contacts to be monitored into two or more groups, and generating select signals which are exclusively related to one of the groups, and using those select signals to gate the control means. Since the output couplers are open collector devices they can readily be multiplied in a wired OR configuration.

Thus, in accordance with one embodiment of the invention, a coupling arrangement is provided for coupling an indication of the state of a contact in the form of a dynamic signal without electrically connecting a representation of the dynamic signal to the contact or any circuit connected electrically thereto, which coupling arrangement comprises:

control means for generating two streams of alternate sequential control pulses, a pair of control pulse responsive switches, each responsive to a different one of said stream of pulses, a pair of conductors, a pair of gating means each responsive to a different one of said switches for connecting one of said two conductors to one of two different potential sources in time coincidence with said two streams of optical pulses, and circuit means including said contact and connected to said two different conductors, and including isolator means for energizing an output of said isolator means in coincidence with one or another of said optical pulse streams depending upon the condition of said contact, whereby when said contact is in one state, said isolator means output is energized coincident with one stream of said pulses, and when said contact is in another state said isolator means output is energized coincident with said other of said pulse streams.

BRIEF DESCRIPTION OF THE DRAWINGS

Specific embodiments of the present invention will now be described so as to enable those skilled in the art to practice the invention, in the following portions of this specification when taken in conjunction with the attached drawings in which like reference characters identify identical apparatus and in which:

FIGS. 2 and 4 are timing diagrams useful in explaining the form of signals appearing on various conductors under various circumstances; and FIG. 3 is part block, part schematic diagram of another embodiment of the invention.

DETAILED DESCRIPTION OF PREFERRED EMBODIMENT

Figure 1:
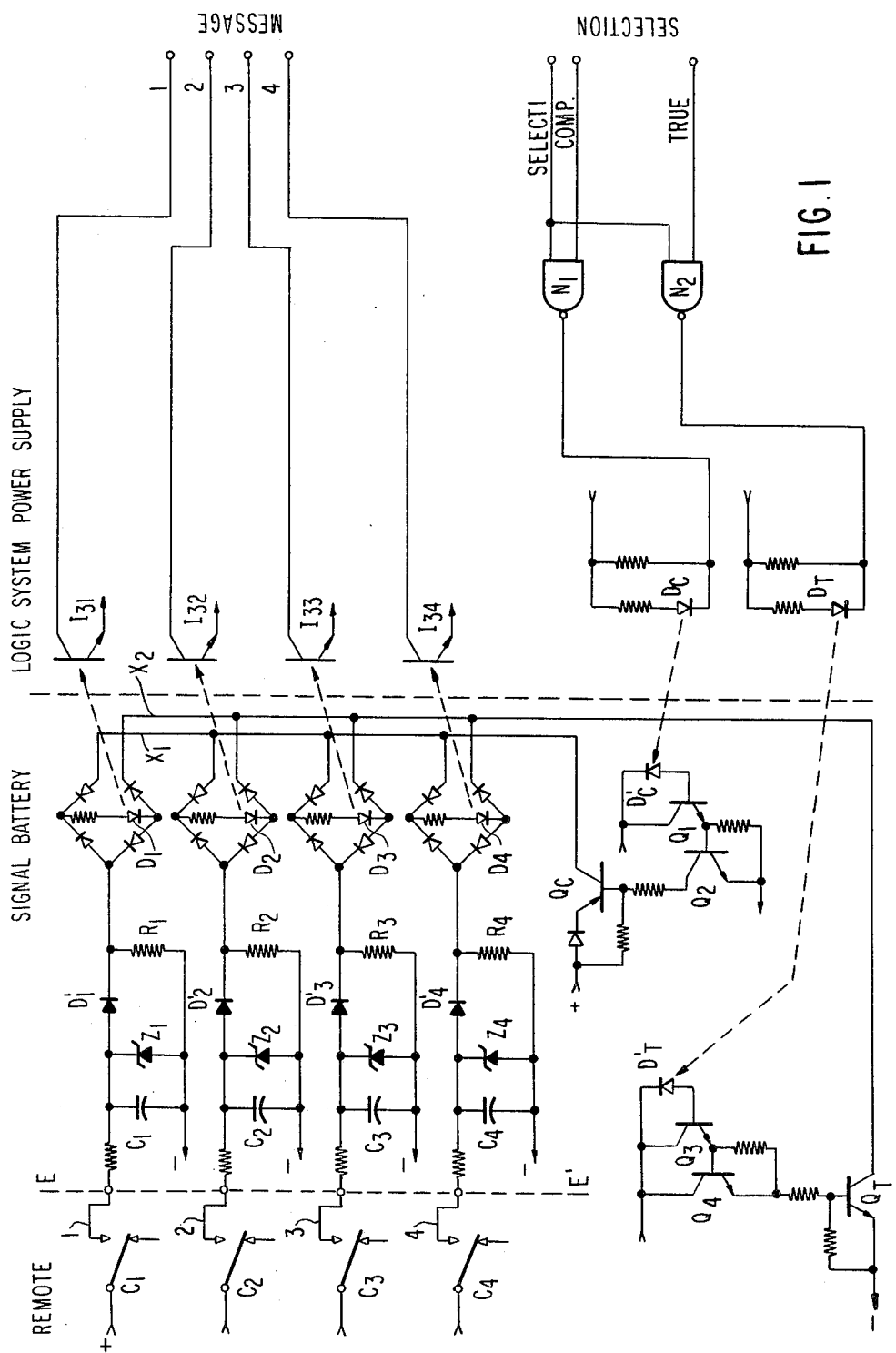
FIG. 1 is a schematic view of one embodiment of the present dynamic contact check circuit.

FIG. 1 shows a plurality of contacts, C1-C4, whose state is to be monitored. Each of these contacts is connected to a signal battery supply, so that when the contact is in one state battery energy is coupled over the contact, and when the contact is in another state, battery energy is not coupled over the contact.

Each of the contacts to be monitored is coupled over a separator conductor, 1-4 to a line filter and surge protector comprising an RC circuit including a capacitor (C1-C4), a zener diode (Z1-Z4) connected in parallel to the capacitor, a diode (D1'-D4') and a resistor (R1-R4). The dash line E-E' separates the contact from the filters, and is intended to represent a relatively long distance conductor connecting the remote contacts to the local apparatus to the right of the line E-E'. While it is one advantage of the invention that the contact being monitored can be spaced a substantial distance from the circuits monitoring the contact, of course the invention is applicable even if the monitoring circuit is adjacent the contacts being monitored. Each of the filters just described is connected to a diode bridge-like circuit at the conjunction of the cathode of diodes (D1'-D4') and the resistor (R1-R4). The bridge-like circuit is not a true bridge inasmuch as the circuit has only three nodes and what would be the fourth node in a true bridge is connected to two different conductors X1 and X2. Diagonally connected across two nodes of the bridge-like circuit is a series combination of a resistor and one element of an isolator which is shown in FIG. 1 as a light emitting diode D1-D4. Conductor X1 is connected to a gating circuit which at times connects the conductor X1 to a positive source of potential, and at other times presents a high impedance condition to the conductor X1.

In the embodiment disclosed in FIG. 1 the control pulses are optical and thus the control pulse responsive switch includes an optically responsive diode and associated transistors. Those skilled in the art will understand that the use of optical energy is desirable although other forms of signal coupling (e.g. transformer) could also be used.

The gating circuit comprises a transistor QC with the emitter coupled to the cathode of a diode whose anode is connected to the positive source of potential, with a resistor connected between the positive source of potential and the base of the transistor QC, and conductor X1 connected to the collector of the transistor QC. The base of the transistor QC is driven by a switch comprised of transistors Q1 and Q2 and optically responsive diode DC'. When optical energy is incident on the diode DC', the switch is enabled by providing base current to transistors Q1 and Q2 which renders transistor QC conductive and places the potential at the emitter of QC on the conductor X1. At other times, in the absence of optical energy impinging on the diode DC', there is no base drive for transistors Q1 and Q2 and transistor QC is turned off, and conductor X1 is in a high impedance state.

The conductor X2 is connected to a similar gating circuit comprising the transistor QT, whose emitter is connected to a negative source of potential. The gate comprising the transistor QT is responsive to a switch including transistors Q3 and Q4 and further optical energy responsive diode DT'. Depending on whether or not optical energy impinges on the diode DT', the transistor QT will either be conducting or non-conducting; when conducting the conductor X2 will be connected to the negative source of potential connected to the emitter of QT, and when QT is not conducting, the conductor X2 is in a high impedance state.

Each of the light emitting diodes D1 through D4 has associated with it, in optically coupling relation, an optical responsive transistor I31 through I34. Accordingly, when current flows through any of the diodes D1 through D4, optical energy is produced, which is coupled through the associated transistor I31-I34, allowing the associated transistor to conduct and pulling its output conductor, connected to the collector of the associated transistor, low. This is referred to as energizing the output of the isolator since these conditions allow current flow. On the other hand, in the absence of current through the diode D1 through D4, the associated transistor in optical coupling relation is not conducting and therefore, its output conductor is at a high potential.

Optical energy is generated for impinging on the diodes DC' or DT' via the control signal generating circuit which includes diodes DC and DT. More particularly, a pair of two input NAND gates N1 and N2 respond, in common, to a select 1 signal, forming one of the inputs to the gates. The other input signal to gate N1 is a complement signal, and the other input to gate N2 is a true signal. It is essential to the invention that the true and complement signals be complementary, that is, each of the signals are capable of achieving one or two possible states at any time, and each signal is the complement of the other, that is, when the true signal is in one logic state, the complement signal is in the other, and vice versa. The output of each of the NAND gates N1 and N2 is coupled to the cathode of an associated light emitting diode DC or DT, whose anode is connected through a resistor to a source of energy, and as is shown in FIG. 1, a further resistor parallels a serial combination of the light emitting diode and previously mentioned resistor.

Assuming that the select 1 signal is in a high logic state, then when the complement signal is in a high logic state (and the true signal is in a low logic state) then NAND gate N1 will produce a low output and current will flow through the light emitting diode DC producing optical energy impinging on optically responsive diode DC'. On the other hand, when the complement signal is at a low logic state and the true signal is in the high logic state, then current will flow through the diode DT, and the resulting optical energy will impinge on the optically responsive diode DT'. As the true and complement signals alternate in voltage level each of the diodes DC and DT will produce a stream of optical pulses, and the pulses will be produced alternately and sequentially.

In response to the pulses produced by the diode DC, the optionally responsive switch including diode DC' will conduct, and in response to the optical pulses produced by the light emitting diode DT, the optically responsive switch including the diode DT' will conduct, and since the optical pulses are produced alternately and sequentially, so will the optically responsive switches including diodes DC' and DT', conduct alternately and sequentially.

Furthermore, since the optically responsive switches are coupled to control the associated gates, the gates including transistors QC and QT will conduct alternately and sequentially, and correspondingly, the conductors X1 and X2 will carry the associated potential alternately and sequentially. That is, at any period of time if conductor X1 is connected to a positive source of potential, the conductor X2 will be in a high impedance state, and conversely, when the conductor X2 is connected to a negative source of potential, the conductor X1 will be in high impedance state.

If we assume that a contact C1 is in the on (energized) state, where it is connected to a positive source of potential, let us examine the condition of the associated LED, D1. When the conductor X1 is connected to a positive source of potential, the power supply for the bridge-like circuit is incomplete; in other words, both the anode and the cathode of the diode D1 are at the same potential and accordingly, no current will flow. As a result, the associated optically coupled transistor I31 will be off, and its output conductor will have a high potential. However, in the other states (later in time, for example) when conductor X2 is connected to a negative source of potential, then the power supply for the bridge-like circuit is completed in that DC energy flows from the signal battery through the closed contact C1, through the resistor, the dioded D1', through the bridge-like circuit including the light emitting diode D1 to the conductor X2 to the negative source of potential. As a result, the light emitting diode D1 produces optical energy which, impinges on the associated transistor I31 causes it to conduct. When transistor I31 conducts, its output conductor is pulled low. Thus, the output conductor of transistor I31 is high at the "true" times, and low at the "complement" times.

Now let us assume that the contact C2 is in a state where it is not connected to the signal battery (deenergized). When conductor X1 is connected to a positive source of potential through the gate including the transistor QC, then the bridge-like circuit has a complete power supply circuit from a positive source of potential, through transistor QC, conductor X1, the bridge-like circuit through the LED D2, the resistor R2 to the negative terminal. Since QC conducts at "complement" times the result is a low potential on the output conductor of transistor I32. At "true" times, the conductor X2 is connected to a negative source of potential, and accordingly, the bridge-like circuit has an incomplete supply circuit. That is, more particularly, the cathode of the diode D2 is at a negative potential, and so is the anode, accordingly, no current flows and the output conductor of transistor I32 is at a high potential.

Figure 4:
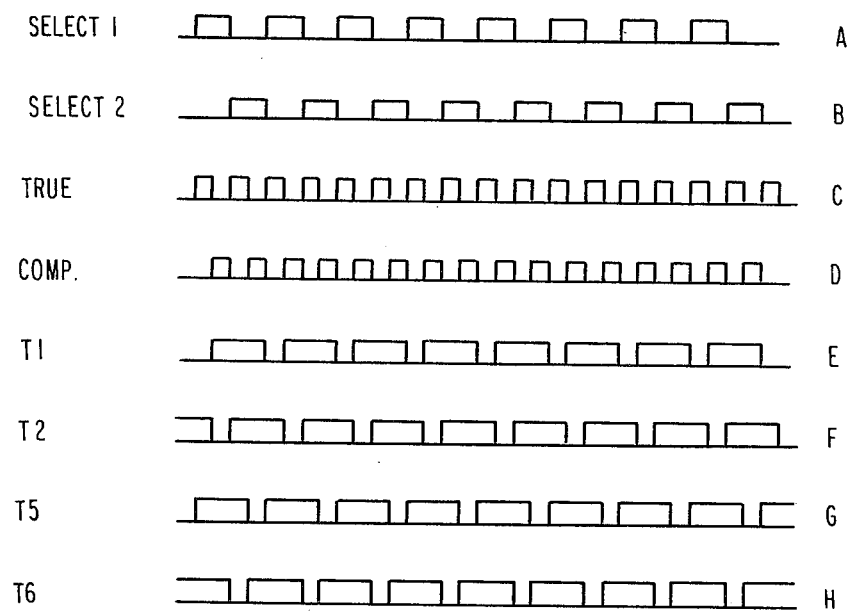

Accordingly, the condition of the contacts C1 and C2, either open or closed, has been translated into a dynamic signal, from which the condition of the contact can be determined by noting whether or not the dynamic signal is high or low at "true" or "complement" times. This operation is represented in FIG. 2, if we assume that the select 1 signal is represented on line A, the true and complement times are represented on lines C and D, then line E represents the condition of the output conductor of transistor I31, line F represents the condition of the output conductor of transistor I32. FIG. 2 shows the select 1 signal as on for a time, long in relation to the duration of the true or complement pulses. As those skilled in the art will be aware there is a wide range within which the duration of the true and complement pulses can be selected, depending in part on the type of load being driven. In one embodiment of the invention that duration is on the order of 20–25 microsec. In that same embodiment, however, the select, pulse duration is equal to twice the duration of the true or complement duration, i.e., 40–50 microsec. Typical pulse shapes for the preferred arrangement is shown in FIG. 4 for conditions corresponding to FIG. 2. Thus, lines E and F, respectively, are at a high potential except when Select 1 is active and then only in the true or complement time depending on the contact condition.

FIG. 3 illustrates another embodiment of the invention in which the contacts to be monitored are broken down into two groups, a first group including contacts C1–C4, and a second group including contacts C5–C8. Each of the groups of contacts are connected to a different dynamic contact check circuit which can take the form shown in FIG. 1 wherein the inputs I1–I4 correspond to the filter inputs of FIG. 1, and the outputs T1–T4 correspond respectively to conductors 1–4 in FIG. 1. In addition to each of the dynanic contact check circuits, FIG. 3 illustrates a select generator which generates a select 1 and select 2 signal, the select 1 signal is connected as the select input to the upper dynamic contact check circuit, and the select 2 signal is the select input to the lower dynamic contact check circuit. Furthermore, FIG. 3 shows a "true"—"complement" generator 15, and as illustrated the "true" and "complement" signals are input to both upper and lower dynamic contact check circuits.

The select generator 10 can comprise an astable multi-vibrator, in the case wherein only two dynamic check circuits are served, since the two outputs of the astable multi-vibrator are mutually exclusive. Those skilled in the art will understand that many other circuits are usable as a select signal generator, the only requirement being that only one of the group of select signals is active at any time, and the select signals are of such duration and repetition rate that each of contacts served by a select signal can be properly sampled during the active time of the select signal.

The true and complement generator 15 also may comprise an astable multi-vibrator, or any other circuit with two outputs, which alternate in voltage level so that only one of the two outputs are active at any time. Any select signal must have a duration sufficient to encompass both a true and complement period.

FIGS. 2 and 4 illustrate for the select 1 and select 2 waveforms shown in lines A and B, and for the true and complement waveforms shown in lines C and D, the resulting output of terminals T1 and T2, T5 and T6 for the case wherein the corresponding contacts C1, C2, C5 and C6 are in the illustrated condition.

Thus, more particularly, when the associated select signal is active, the corresponding output takes the form discussed in connection with FIG. 1. When the corresponding select signal is not active, the associated outputs are at a high logic level.

FIG. 3 also suggests that the eight different outputs can be multiplexed on four conductors by jumping the output terminals T1-T8 to the associated terminals U1-U8 so that the condition of contacts C1 and C5 can be determined from the signal on the conductor C1/C5, etc., taken in conjunction wit the output of the select generator 10. More particularly, when the select 1 signal is active the conductor C1/C5 carries a signal corresponding to the condition of contact C1, and when the select 2 signal is active that same conductor carries a signal representative of the condition of contact C5, etc. Inasmuch as the output transistors I31-I34 are open collector, output transistor I31 can be connected in a "wired OR" circuit with an output transistor I35 (the output transistor associated with C5), by simply connecting the terminal T1-U1 with the terminal T5-U5, as is shown in FIG. 3. When select 1 is active, and select 2 is not active, transistor I35 will allow a high potential to the conductor C1/C5, but when transistor I31 is pulled low, that will effectively pull the conductor C1/C5 low.

Accordingly, FIG. 3 illustrates multiplexing signals representative of contacts in two different groups, on a single conductor. It should be apparent to those skilled in the art that the invention is not limited to multiplexing only the condition of two contacts on a single conductor, but the number of signals representative of the condition of different contacts can be multiplexed on a single conductor is only limited by the number of exclusive select signals that are used to activate dynamic contact check circuits serving different groups of contacts.

It should also be apparent that many changes can be made to the preferred embodiments specifically disclosed herein without departing from the spirit and scope of the present invention and accordingly, applicant intends these preferred embodiments as exemplary and not limiting.

What is claimed is:

1. A coupling arrangement for coupling an indication of the state of a contact in the form of a dynamic signal without electrically connecting a representation of said dynamic signal to said contact or any circuit electrically connected thereto, said coupling arrangement comprising:

control means for generating two streams of alternate sequential control pulses, a pair of control pulse responsive switches, each responsive to a different one of said stream of pulses, a pair of conductors, a pair of gating means each responsive to a different one of said switches for connecting one of said two conductors to one of two different potential sources in time coincidence with said two streams of optical pulses, circuit means, including said contact and connected to said two different conductors, including isolator means for energizing an output of said isolator means in coincidence with one or another of said control pulse streams depending on the condition of said contact, whereby when said contact is in one state, said output of said isolator means is energized coincident with one stream of said pulses, and when said contact is in another state, said output of said isolator means is energized coincident with said other of said pulse stream.

2. The apparatus of claim 1 wherein said control means generates optical pulses and wherein said control pulse responsive switches each include switch means responsive to said optical pulses.

3. The apparatus of claim 1 or 2 wherein
said isolator means comprises an optical isolator including a light emitting diode in said circuit means and said output of said isolator means comprises an optically responsive transistor.

4. The apparatus of claim 1 for monitoring the state of an additional contact, including
additional control means, pair of control pulse responsive switches, a pair of gating means and circuit means, and
a select signal generator for generating a select signal corresponding exclusively to said contact or additional contact,
said control means and said additional control means responsive to said select signal for generating said two streams of alternate and sequential pulses only in the presence of a corresponding select signal, whereby said isolator means is deenergized in the absence of a corresponding select signal.

5. The apparatus of claim 4 which includes connecting means connecting a corresponding terminal of isolator means of said circuit means and said additional circuit means.

6. The apparatus of claim 1 wherein said circuit means includes a line filter connected between said contact and said pair of conductors.

7. The apparatus of claim 6 wherein said circuit means includes a surge protector connected between said line filter and said pair of conductors.

8. The apparatus of claim 1 wherein said isolator means includes a light emitting diode and light responsive active element,
a first uni-conducting serial circuit connecting a first of said pair of conductors to a fixed potential,
a second uni-conducting serial circuit connecting the other of said pair of conductors to a potential which is or is not at a second fixed potential depending upon the state of said contact, both said first and second uni-conducting serial circuits including said light emitting diode of said isolator means.

9. A dynamic contact check circuit for monitoring the state of a contact which, in one state is at a given potential, and in the other state is not at said given potential comprising:

optical signal generator means for generating a first optical pulse stream and a second optical pulse stream complementary to said first optical pulse stream, first and second optically responsive switches responsive, respectively to said first and second optical pulse stream, first and second conductors, first and second gating means responsive, respectively, to said first and second switches and connected respectively between a first potential and said first conductor and a second potential and said second conductor, for connecting said conductors to said associated potentials in coincidence with said associated pulse streams, circuit means connected to said conductors and said contact and including an optical pulse generator for completing a current supply circuit through said optical pulse generator in coincidence with said first or second optical pulses depending on whether said contact is or is not at said given potential, and an output circuit with an optically responsive switch which is or is not closed depending on whether or not current flows in said optical pulse generator, whereby said optically responsive switch is energized in coincidence with said first or second optical pulse stream depending on whether said contact is or is not at said given potential.

10. The apparatus of claim 9 wherein said circuit means includes three nodes and four unidirectionally conducting devices, a first, current receiving, node connected to receive current flow from either of two of said uni-directionally conducting devices, one connected to said first conductor or a second connected at a second node to receive current flow from said contact, a third, current emitting, node connected to emit current flow one to one of another two of said uni-directionally conducting devices, a third connected to said second conductor or a fourth connected to said second node, said optical pulse generator connected between said first and third nodes, and impedance means coupling said second node to a current sink.

11. The apparatus of claim 10 which includes a diode with cathode connected to said second node and a surge protector connected between an anode of said diode and said current sink, a line filter connected between said contact and said diode's anode.

12. The apparatus of claim 9 for monitoring the state of a plurality of groups of contacts, each group including plural contacts, and further including, additional optical signal generator means sufficient to provide a different optical signal generator means for each of said groups of contacts, a select signal generator for generating a plurality of mutually exclusive binary signals, one for each of said groups, each of said optical signal generator means energized by a different one of said mutually exclusive signals, additional pairs of optically responsive switches sufficient to provide a pair for each of said groups, each different pair responsive to a different one of said optical signal generators, additional pairs of conductors sufficient to provide a pair for each of said groups, additional circuit means, sufficient to provide a circuit means for each of said contacts, each circuit means in a group connected to conductors associated with said group, and additional output circuits sufficient to provide an output circuit for each of said contacts whereby each of said output circuits is energized only when current flows in the associated optical pulse generator.

13. The apparatus of claim 12 which includes a plurality of jumpers, equal in number to the number of contacts in a group, each jumper connecting in common one output circuit in each of said groups whereby said jumper is energized when any of its connected output circuits is energized.

14. The apparatus of claim 9 which further includes a surge protector and line filter connected between said contact and said circuit means.

* * * * *